United States Patent
Ma et al.

(10) Patent No.: US 10,959,319 B2
(45) Date of Patent: Mar. 23, 2021

(54) COOLING PACKAGE AND POWER MODULE

(71) Applicant: Telefonaktiebolaget LM Ericsson (publ), Stockholm (SE)

(72) Inventors: Tai Ma, Beijing (CN); Peihua Li, Shanghai (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/344,640

(22) PCT Filed: Oct. 25, 2016

(86) PCT No.: PCT/CN2016/103234
§ 371 (c)(1),
(2) Date: Apr. 24, 2019

(87) PCT Pub. No.: WO2018/076177
PCT Pub. Date: May 3, 2018

(65) Prior Publication Data
US 2020/0068700 A1    Feb. 27, 2020

(51) Int. Cl.
*H05K 1/02* (2006.01)
(52) U.S. Cl.
CPC ........... *H05K 1/0206* (2013.01); *H05K 1/021* (2013.01); *H05K 2201/0305* (2013.01); *H05K 2201/0367* (2013.01)
(58) Field of Classification Search
CPC . H05K 1/0201–021; H05K 2201/0305; H05K 2201/0367
See application file for complete search history.

(56) References Cited

U.S. PATENT DOCUMENTS

| | | | | |
|---|---|---|---|---|
| 5,608,566 A | * | 3/1997 | Dutta | B82Y 20/00 359/248 |
| 6,058,013 A | * | 5/2000 | Christopher | H01L 23/3677 165/185 |
| 6,466,454 B1 | | 10/2002 | Jitaru | |

(Continued)

FOREIGN PATENT DOCUMENTS

| CN | 101802937 A | 8/2010 |
|---|---|---|
| CN | 102917571 A | 2/2013 |

(Continued)

OTHER PUBLICATIONS

International Search Report and Written Opinion issued in International Application No. PCT/CN2016/103234, dated Jul. 28, 2017, 12 pages.

(Continued)

*Primary Examiner* — Hoa C Nguyen
(74) *Attorney, Agent, or Firm* — Patent Portfolio Builders, PLLC

(57) ABSTRACT

A cooling package in a power module comprises a first side for placing one or more semiconductor components; one or more holes for placing one or more magnetic components; and a second side with one or more connection parts. Therefore, all components of a power module which need to dissipate the heat have two thermal dissipation paths, therefore the heat inside the module can be greatly reduced.

11 Claims, 7 Drawing Sheets

(56) References Cited

U.S. PATENT DOCUMENTS

| | | | |
|---|---|---|---|
| 7,474,185 B2* | 1/2009 | Hooey | H01F 27/266 |
| | | | 336/55 |
| 9,507,391 B2* | 11/2016 | Busch | G06F 1/20 |
| 2002/0054480 A1 | 5/2002 | Jitaru | |
| 2005/0152117 A1 | 7/2005 | Belady et al. | |
| 2007/0115643 A1* | 5/2007 | Chen | H05K 7/20445 |
| | | | 361/719 |
| 2007/0296533 A1* | 12/2007 | Springett | H01F 27/2804 |
| | | | 336/200 |
| 2009/0079528 A1 | 3/2009 | Shabany et al. | |
| 2014/0118954 A1 | 5/2014 | Shi et al. | |
| 2015/0201533 A1 | 7/2015 | Daughtry, Jr. et al. | |
| 2017/0034899 A1 | 2/2017 | Chen et al. | |

FOREIGN PATENT DOCUMENTS

| | | |
|---|---|---|
| CN | 103650655 A | 3/2014 |
| CN | 103929935 A | 7/2014 |
| CN | 204859861 U | 12/2015 |
| WO | 00/02430 A1 | 1/2000 |

OTHER PUBLICATIONS

Extended European Search Report dated Oct. 1, 2019 issued for European Patent Application No. 16920196.9, 8 pages.

\* cited by examiner

COOLING PACKAGE AND POWER MODULE

CROSS REFERENCE TO RELATED APPLICATION(S)

This application is a 35 U.S.C. § 371 National Stage of International Patent Application No. PCT/CN2016/103234, filed Oct. 25, 2016, designating the United States.

TECHNICAL FIELD

The present disclosure relates to a cooling technology, and more particularly, to a cooling package for power modules.

BACKGROUND

In sealed environment, such as outdoor telecom radio units, the whole unit is water proof which means no fan inside the product, therefore the power module's heat dissipation path is the only conduction through heat sink. Consequently, most of power modules need de-rating over 50% current (As shown by FIG. 1) in sealed environment.

For high power stranded power module, there are two technical solutions that exist in the prior art, one is multilayer PCB (Printed Circuit Board) power module (As shown by FIG. 2), the winding for magnetic component 107 is designed in the multilayer PCB 101, and another one is aluminum base power module (As shown by FIG. 3), it has two-story structure, all discrete power semiconductor 201 and magnetic component 202 are mounted in aluminum base board 205, control circuit is in control board 207, there is multiple connection pin 206 to connect these two boards.

For multilayer PCB module, the top side is in contact with heat sink 102 for cooling by TIM (Thermal Interface Material) 103, input pin 104 and output pin 105 in bottom side is mounted to mother board 106 only for electrical connection. For aluminum base power module which is a two-story structure, power semiconductor component 201 and magnetic components 202 are mounted to aluminum plate 203 which can contact heat-sink 204 by TIM 205 for cooling, small pin 206 in aluminum plate 203 connects with control board 207 for communication, input pin 208 and output pin 209 are mounted with mother board 210 for electrical connection. For aluminum board 203, between aluminum base 211 and copper 212, there is TIM 213 inside, the lower the thermal resistance for TIM the higher the cost. Intension to increase power density, one way is increasing efficiency which is not economical and limited by electric technology; another way is minimizing thermal resistance with heat sink.

But both solutions have shortages, for PCB, and all components which need to dissipate the heat, including magnetic component, power semiconductor component, and controller, only have one cooling path which is used to conduct the heat to heat-sink by TIMs. The TIM is used for compensating the mechanical tolerance. Therefore, the module has very high thermal resistance in system, for sealed environment; there is no airflow inside. Consequently, the power module has to de-rate the output power a lot.

SUMMARY

It is an object of the present disclosure to provide a cooling package, a power module and an electronic device, capable of greatly reducing the heat inside the module by using two thermal dissipation paths.

In a first aspect, a cooling package in a power module is provided. The cooling package comprises a first side for placing one or more semiconductor components; one or more holes for placing one or more magnetic components; and a second side with one or more connection parts.

In an embodiment, the connection parts are solder bumps using for heat conducting.

In a second aspect, a power module is provided. The power module comprises one or more semiconductor components; one or more magnetic components; and a cooling package, where the cooling package comprises a first side for placing one or more semiconductor components; one or more holes for placing one or more magnetic components; and a second side with one or more connection parts.

With the embodiments of the present disclosure, all components of a power module which need to dissipate the heat have two thermal dissipation paths, therefore the heat inside the module can be greatly reduced.

BRIEF DESCRIPTION OF THE DRAWINGS

The above and other objects, features and advantages will be more apparent from the following description of embodiments with reference to the figures, in which.

DETAILED DESCRIPTION

The embodiments of the disclosure will be detailed below with reference to the drawings. It should be noted that the following embodiments are illustrative only, rather than limiting the scope of the disclosure.

Figure 1:
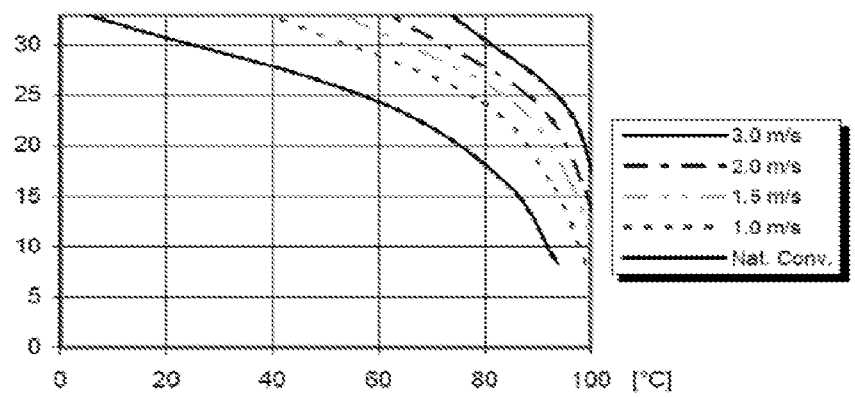
FIG. 1 is a figure illustrating a current de-rating of a power module in the prior art.
Figure 2:
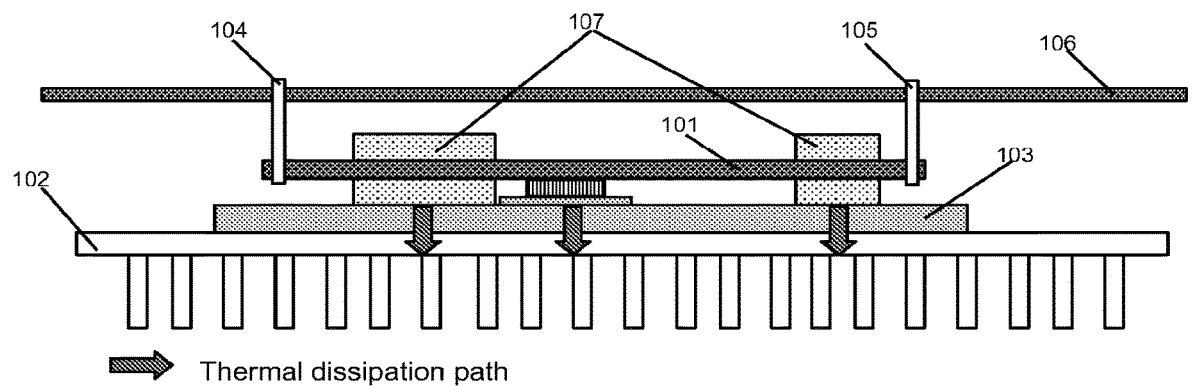
FIG. 2 is a figure illustrating a thermal dissipation in a multilayer PCB power module.
Figure 3:
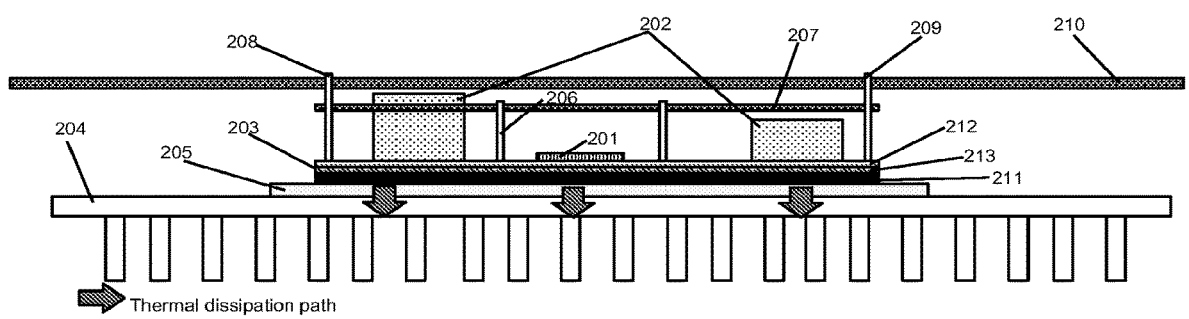
FIG. 3 is a figure illustrating a thermal dissipation in an aluminum base power module.
Figure 4:
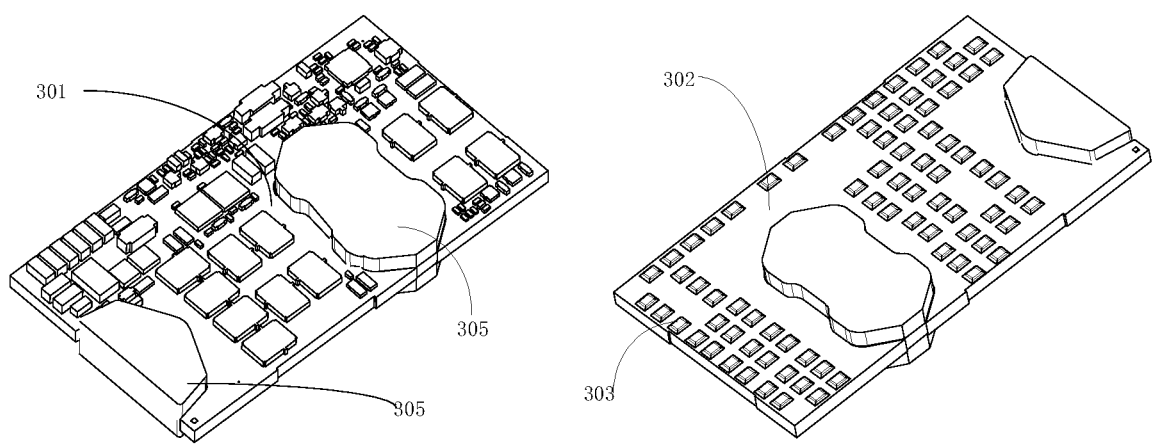
FIG. 4 is a figure illustrating a power module according to an embodiment of the present disclosure.

FIG. 4 is a figure illustrating a power module according to an embodiment of the present disclosure. A multilayer power module has a top side 301 and a bottom side 302. All components are mounted on top side 301, the bottom side 302 being reserved for connection parts. The connection parts can be pre-soldered as solder bumps 303 to provide good solder-ability. As an alternative, the connection parts can be metal connection pads or pins.

Meanwhile, a cooling package is illustrated, which comprises a top side 301 for placing one or more semiconductor components; one or more holes for placing one or more magnetic components 305; and a bottom side with one or more connection parts.

The module can be picked and placed by SMT (Surface Mount Technology) machine and reflow compatible. The board on which power module is mounted is host board. The module can be mounted on top side of host board or on the bottom side of host board based on different application scenarios.

Figure 5:
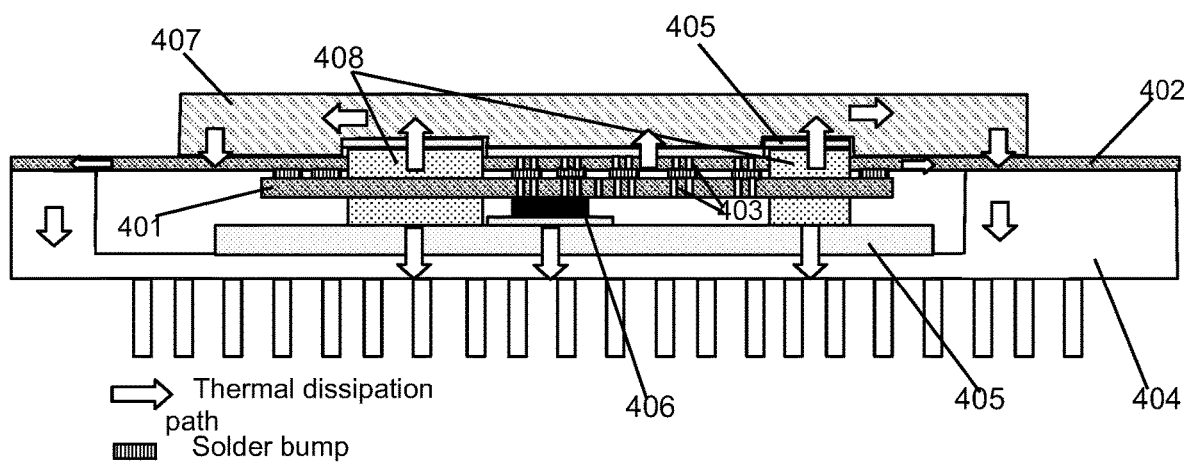
FIG. 5 is a figure illustrating a thermal dissipation of a power module according to an embodiment of the present disclosure.

FIG. 5 is a figure illustrating a thermal dissipation of a power module according to an embodiment of the present disclosure. As shown by FIG. 5, all solder bumps of multilayer PCB power module 401 will be soldered to equivalent solder pads on host board by soldering. Large areas of copper internal and external which belong to reference net like GND on host board 402 are connected by thermal vias 403 which can tightly contact to heat sink 404 directly without any TIM 405, therefore, the module can dissipate the heat through the host board 402, or through the baseplate or cover 407 then host board.

Figure 6:
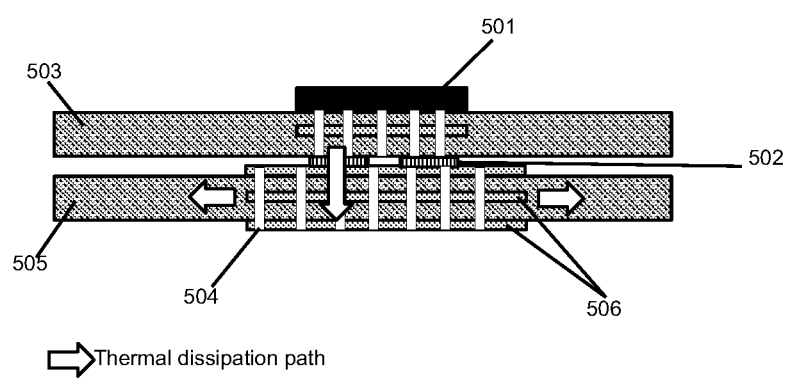
FIG. 6 is a figure illustrating a thermal dissipation of a power module using two thermal dissipation paths according to an embodiment of the present disclosure.

FIG. 6 is a figure illustrating a thermal dissipation of a power module using two thermal dissipation paths according to an embodiment of the present disclosure. By using the cooling package disclosed by the present disclosure, the multilayer PCB and all components which need to dissipate the heat can have two paths to conduct the heat:

For PCB: the first thermal dissipation path is from solder bumps to host board 402, another one is the side contact with heat sink 404 and TIM 405.

For semiconductor components 406, 501: Heat generated components on module like MOSFET (Metal-Oxide-Semiconductor Field-Effect Transistor), Diodes, ICs and other semiconductor components will connect to solder bumps 502 of power module 503 through many via holes 504. At the same time, solder bumps of power module are connected to pads on host board. The pads on host board 505 will connect to large area copper 506 on inner layer or external layer through via holes as same reference net. Top side of host board can be connected to baseplate or cover 407 by TIMs for thermal transfer and heat balance. This net can spread heat out to the whole host board 505 through PCB materials.

For magnetic components 408: transformers and inductors are bottle neck for switch power module to output more power, because the temperature limit normally is 125 degree and high power loss. For heat dissipation of cores in these components: one side can contact with cover/baseplate by TIM, another side can contact with heat-sink by TIM. For heat dissipation of windings in these components: one path is solder pads conduct the heat to host board, another path is through the semiconductor component's case, as for most topology the magnetic component's winding should connect with MOSFET or Diodes, also through the cores to dissipate the heat as normal power module.

Figure 7:
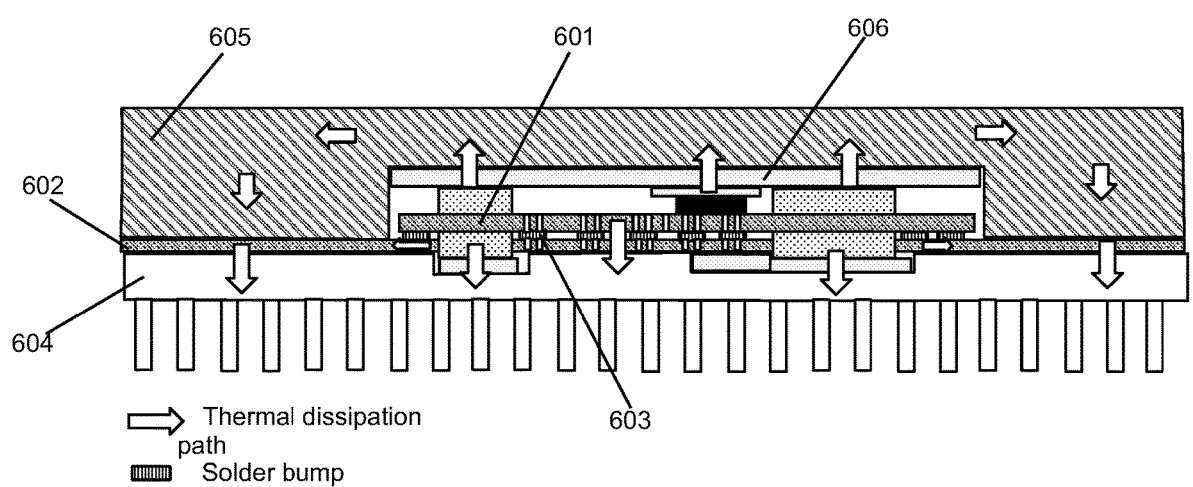
FIG. 7 is a figure illustrating a thermal dissipation of a power module according to another embodiment of the present disclosure.

FIG. 7 is a figure illustrating a thermal dissipation of a power module according to another embodiment of the present disclosure. In this embodiment, bottom side of host board does not have enough space for a power module, such as heat pipes in heat-sink. For this case, the module 601 can be mounted to another side of host board 602, the module still has double heat dissipation path, one path is that solder with host board by solder bumps 603 which contact with heat-sink 604, another path is contact with cover or baseplate 605 by TIM 606.

The disclosure has been described above with reference to embodiments thereof. It should be understood that various modifications, alternations and additions can be made by those skilled in the art without departing from the spirits and scope of the disclosure. Therefore, the scope of the disclosure is not limited to the above particular embodiments but only defined by the claims as attached.

The invention claimed is:

1. A cooling package in a power module, the cooling package comprising:
   a first side for placing one or more semiconductor components;
   one or more holes for placing one or more magnetic components; and
   a second side with one or more connection parts,
   wherein the power module is mounted upon a host board, wherein the host board is mounted between: a heat sink, and a cover or a baseplate, and wherein the heat sink, and the cover or the baseplate are mounted upon the cooling package.

2. The cooling package of claim 1, wherein the one or more connection parts are one or more solder bumps that are used for heat conducting.

3. The cooling package of claim 1, wherein one or more thermal vias are formed under the one or more connection parts.

4. The cooling package of claim 1, wherein the heat sink is mounted upon the first side.

5. The cooling package of claim 1, wherein the host board is mounted upon the second side.

6. The cooling package of claim 1, wherein the cover or the baseplate is mounted upon the second side.

7. The cooling package of claim 1, wherein the cover or the baseplate is mounted upon the first side.

8. The cooling package of claim 1, wherein the heat sink is mounted upon the second side.

9. A power module, comprising:
   one or more semiconductor components;
   one or more magnetic components; and
   a cooling package of claim 1.

10. An electronic device, comprising a power module of claim 9.

11. The cooling package of claim 1, wherein the one or more connection parts are one or more solder bumps, and wherein the one or more solder bumps are connected to equivalent one or more solder pads on the host board.

* * * * *